(12) United States Patent
Tsuruta et al.

(10) Patent No.: US 7,440,201 B2
(45) Date of Patent: Oct. 21, 2008

(54) LENS DRIVING DEVICE AND PORTABLE EQUIPMENT WITH CAMERA

(75) Inventors: Toshifumi Tsuruta, Nagano (JP); Hidekazu Yoneyama, Nagano (JP); Masao Yajima, Nagano (JP); Sadayoshi Yasuda, Nagano (JP)

(73) Assignee: Nidec Sankyo Corporation, Nagano (JP)

( * ) Notice: Subject to any disclaimer, the term of this patent is extended or adjusted under 35 U.S.C. 154(b) by 805 days.

(21) Appl. No.: 10/698,053

(22) Filed: Oct. 30, 2003

(65) Prior Publication Data

US 2004/0207745 A1    Oct. 21, 2004

(30) Foreign Application Priority Data

Apr. 16, 2003 (JP) .............................. 2003-111735
Jun. 27, 2003 (JP) .............................. 2003-185452

(51) Int. Cl.
G02B 7/02 (2006.01)
(52) U.S. Cl. .................... 359/824; 359/694; 359/814; 359/822
(58) Field of Classification Search .................. 359/824
See application file for complete search history.

(56) References Cited

U.S. PATENT DOCUMENTS 5,572,372 A * 11/1996 Sekine et al. ............... 359/824
5,828,503 A * 10/1998 Kaneda et al. ............. 359/824

FOREIGN PATENT DOCUMENTS

| JP | 04-222444 | 8/1992 |
| JP | 10-150759 | 6/1998 |
| JP | 2000-187862 | 7/2000 |
| JP | 2001-091981 | 4/2001 |

* cited by examiner

*Primary Examiner*—Jessica T Stultz
(74) *Attorney, Agent, or Firm*—Hogan & Hartson LLP

(57) ABSTRACT

A lens driving device includes a moving body having a lens and a drive magnet that is moveable with the lens in an optical axis direction of the lens, and a fixed body that moveably supports the moving body in the optical axis direction. The fixed body includes a first drive coil and a second drive coil that are disposed in the optical axis direction and form magnetic circuits with the drive magnet, and a first magnetic member and a second magnetic member that are disposed opposite the first drive coil and the second drive coil, respectively. The moving body is retained at a first position by magnetic attraction working between the drive magnet and the first magnetic member when energization of the first drive coil is stopped. The moving body is also retained at a second position by magnetic attraction working between the drive magnet and the second magnetic member when energization of the second drive coil is stopped.

9 Claims, 9 Drawing Sheets

LENS DRIVING DEVICE AND PORTABLE EQUIPMENT WITH CAMERA

BACKGROUND OF THE INVENTION

1. Field of the Invention

The present invention relates to lens driving devices that are generally used for relatively small sized cameras, such as, cameras for portable equipment with camera unit including portable telephones with camera unit. The present invention also relates portable equipment with camera.

2. Related Background Art

When taking pictures with a portable telephone with digital camera unit, the user typically holds the portable telephone with one hand to take pictures of the user's face or other closely located subjects in many occasions. For this reason, many of the photographing lens systems that are used for this type of camera have a close-up photographing function. The photographing lens system with such a close-up photographing function has different lens positions for ordinary photographing and close-up photographing, or macro photographing. Typically, the lens is positioned slightly closer to subject by a predetermined distance than its position in the ordinary photographing.

For this reason, the photographing lens system of the type described above is equipped with a driving source to move the lens to two different positions for ordinary photographing and macro photographing. The driving source is driven with a switch to move the lens between the two different photographing positions. However, for portable equipment such as portable telephones, it is difficult to use a motor as a driving source as it hinders the reduction in size and weight of the equipment. Instead, such portable equipment often uses a lens driving device in which an electromagnetic force is directly used for driving a lens to move the lens.

A lens driving device of the type in which an electromagnetic force is directly used to move a lens is typically equipped with a cylindrical case that retains a lens, a ring-shaped drive magnet mounted on an outer circumference of the case, and a drive coil that opposes the drive magnet. While energization of the drive coil is controlled to magnetically drive the case that retains the lens in an optical axis direction to a designated position, the case is retained at the designated position by a magnetic force.

Also, another lens driving device may be quipped with a case having a lens mounted thereon, wherein the case is rotated in its circumferential direction, and the rotational movement is converted into movements in an optical axis direction such that the case is moved in the optical axis direction.

Still another lens driving device proposed is an electromagnetic actuator for camera that is equipped with a moving body with a coil wound around is freely pivotally mounted on a shaft. The moving body is sandwiched by magnets and yokes from both sides of the moving body in an axial direction. The moving body is swung about the shaft by an electromagnetic thrust that is generated between the coil and the magnets and in a direction parallel with opposing surfaces of the moving body, and swinging motions of the moving body are converted to linear movements of the lens system by a cam mechanism.

However, in the lens driving devices of the type in which the case that retains the lens is magnetically driven in an optical axis direction to a designated position, and the case is magnetically retained at the position, if the lens is to be retained at the position for a long time, the drive coil needs to be energized during that period. For this reason, the lens driving device of this type has problems, namely, it has a large power consumption, and therefore is not suitable for mounting on portable telephones that basically have a limited power supply battery capacity.

In contrast, in the lens driving device of the type in which the case is rotated in its circumferential direction to move the case in a rotational axis direction, i.e., optical axis direction, there is an advantage that the lens driving device has a relatively low power consumption because it does not require an electromagnetic force to retain the case at a specified position. However, the lens driving device of the this type has a complex structure because it needs to convert the rotational force into linear movements, and includes a large number of components, and therefore is not suitable for mounting on portable equipment such as portable telephones.

The electromagnetic actuator for camera described above needs to be equipped with a mechanism that swings the moving body by an electromagnetic force, and a cam mechanism that converts swinging motions into linear movements. As a result, the lens driving device of the this type has a complex structure, and includes a large number of components, and its mechanism spreads outside the lens system. For this reason, its miniaturization is difficult, and therefore it is not suitable for mounting on portable equipment such as portable telephones.

SUMMARY OF THE INVENTION

The present invention has been made to solve the technical problems described above, and relates to a lens driving device that is suited for miniaturization and to portable equipment with camera having such a lens driving device. In addition, the present invention also relates to a lens driving device that does not need to supply power to retain a lens member at a specified position to thereby reduce power consumption, and to portable equipment with camera having such a lens driving device.

In accordance with an embodiment of the present invention, a lens driving device includes a moving body equipped with a lens, and a fixed body that moves the moving body in an optical axis direction of the lens and retains the moving body at specified positions. The moving body is equipped with one of a drive magnet and a drive coil. The fixed body is equipped with the other of the drive magnet and the drive coil. The drive magnet and the drive coil moveably dispose the moving body in the optical axis direction by their mutual magnetic attractive force or mutual magnetic repelling force.

As a result, the lens driving device has a relatively simple structure, and a fewer components, which is suitable for miniaturization. Moreover, since the drive magnet and the drive coil are disposed in the optical axis direction, the lens driving device can be further reduced in size in its radial direction.

The drive coil may preferably be wound in a manner to encircle the optical axis of the lens, and the drive magnet is formed in a ring shape having a hole in its center. The ring-shaped drive magnet has an inner circumferential section that surrounds the hole, and an outer circumferential section, wherein the inner circumferential section of the drive magnet is magnetized with a single pole of one of N pole and S pole, and the outer circumferential section is magnetized with a single pole of the other of N pole and S pole. With this structure, at least two drive coils can be disposed in the lens optical axis direction above and below the drive magnet at corresponding locations, such that further miniaturization and simplification of the structure can be achieved.

In one aspect of the present invention, the lens driving device may preferably include a position retaining device that retains the moving body with respect to the fixed body at a specified position when energization of the drive coil is stopped. As a result, power does not need to be supplied to the drive coil when the lens is retained at a specified position, and therefore the power consumption can be reduced.

Moreover, the position retaining device may preferably be a magnetic device that retains the moving body with a magnetic attraction force at a specified position. As a result, the position retaining device can be formed with a relatively simple structure, and the cost can be readily reduced.

In accordance with another embodiment of the present invention, a lens driving device includes a moving body equipped with a lens, and a fixed body that moves the moving body in an optical axis direction of the lens and retains the moving body at specified positions. The moving body is equipped with a drive magnet that is moveable with the lens in the optical axis direction. The fixed body is equipped with a first drive coil and a second drive coil that are disposed in the optical axis direction of the lens and form magnetic circuits with the drive magnet, and a first magnetic member and a second magnetic member that are disposed opposite the first drive coil and the second drive coil, respectively. The moving body is retained at a specified position by magnetic attraction working between the drive magnet and the first magnetic member or the second magnetic member when energization of the first drive coil or the second drive coil is stopped, and the moving body is moved between the first drive coil and the second drive coil through energization of the first drive coil or the second drive coil.

According to the present embodiment example, when at least one of the first drive coil and the second drive coil is energized in one direction, the moving body moves together with the lens in one direction along the optical axis direction. When at least one of the first drive coil and the second drive coil is energized in an opposite direction, the moving body moves together with the lens in an opposite direction along the optical axis direction. Accordingly, the lens driving device has a simple structure and a few components, and thus is suitable for miniaturization. In addition, at each of the retaining positions of the moving body, the moving body is retained by a magnetic attraction force working between the drive magnet and the first magnetic member or the second magnetic member. While the moving body is retained at the respective retaining positions, the drive coil does not need to be energized, and therefore the power consumption can be reduced to low levels.

In another aspect of the present invention, the drive magnet may be disposed between the first drive coil and the second drive coil. With this structure, the structure of the moving body that moves in the optical axis direction can be simplified, and the structure for disposing the fixed body can also be simplified.

Furthermore, the moving body includes a cylindrical lens barrel that retains the lens, and the drive magnet in a ring shape may be affixed in one piece on the outer circumference of the lens barrel. As a result, the configuration of the drive magnet is simplified, and the structure of the moving body is also simplified.

In accordance with another embodiment of the present invention, a lens driving device includes a moving body equipped with a lens, and a fixed body that moves the moving body in an optical axis direction of the lens and retains the moving body at specified positions. The moving body is equipped with a drive coil and a magnetic member. The fixed body is equipped with a first drive magnet and a second drive magnet disposed in the optical axis direction of the lens, and the drive coil is interposed between the first drive magnet and the second drive magnet. The first drive magnet and the second drive magnet form together with the drive coil a magnetic circuit. When energization of the drive coil is stopped, the moving body is retained at a specified position by magnetic attraction between the magnetic member and one, of the first drive magnet and the second drive magnet. When the drive coil is energized, the moving body is moved between the first drive magnet and the second drive magnet.

As a result, the lens driving device becomes suitable for miniaturization as it has a simpler structure, and a fewer number of components. In its operation, the moving body can be moved in mutually opposing directions depending on the direction of energization of the drive coil. The moving body is retained by a magnetic attraction force between the first drive magnet or the second drive magnet and the magnetic member at one of the shifted positions or the other of the shifted positions of the moving body. While the driving member is retained at these positions, the drive coil does not need to be energized, and therefore the power consumption can be lowered.

A buffer member may preferably be disposed in front of the fixed body as a part thereof. The buffer member may transmit light from subjects and prevent the moving body from moving forward. As a result, dirt and dust on the subject side can be prevented from entering in the lens driving device with a relatively simple structure. Also, the forward movement of the moving body can be stopped without an impact.

In accordance with another embodiment of the present invention, a portable equipment with camera is equipped with the lens driving device in any one of the configurations described above in its camera section.

Since the lens driving device section of the portable equipment with camera has a simpler structure and a fewer components, the camera section can be readily assembled, and thus the assembly efficiency can be improved. Moreover, since the lens driving device is in a configuration suitable for miniaturization, the camera section can be made smaller in size, and therefore the overall weight of the portable equipment can be reduced, and the original functions of the portable equipment can be amply loaded in sections of the equipment other than the camera section such that higher functions can be more readily achieved.

In accordance with another embodiment of the present invention, a portable equipment with camera is equipped with the lens driving device in any one of the configurations described above, a cover disposed on an object lens side of the lens driving device, which transmits light from subjects and prevents dirt and dust on the subject side from entering, and an image pickup element that is disposed on the opposite side of the cover in the optical axis direction with the lens of the lens driving device interposed in between. The surface of the cover is exposed on an exterior side of the lens driving device, and a circuit substrate that is connected to the image pickup element is disposed in the rear back of the lens driving device within a diameter of the lens driving device.

The portable equipment with camera has an advantage in terms of prevention of the ingress of dirt and dust, and the lens driving device can be readily assembled into the portal equipment. Also, since the lens driving device section of the portable equipment with camera has a simpler structure and a fewer components, its camera section can be readily assembled, and therefore the assembly efficiency is improved. Moreover, since the lens driving device is in a configuration suitable for miniaturization, the camera section can be made smaller in size, and therefore the overall weight of the portable equipment can be reduced, and the original functions of the portable equipment can be amply loaded in sections of the equipment other than the camera section such that higher functions can be more readily achieved.

Other features and advantages of the invention will be apparent from the following detailed description, taken in conjunction with the accompanying drawings that illustrate, by way of example, various features of embodiments of the invention.

DESCRIPTION OF PREFERRED EMBODIMENTS

Lens driving devices and portable equipment with camera in accordance with preferred embodiments of the present invention will be described with reference to the accompanying drawings. Each of the lens driving devices to be described below is suitable for mounting on a camera section of portable equipment such as portable telephones with camera, and each of the lens driving devices can also be mounted on other portable equipment such as personal digital assistances (PADs).

Figure 1:
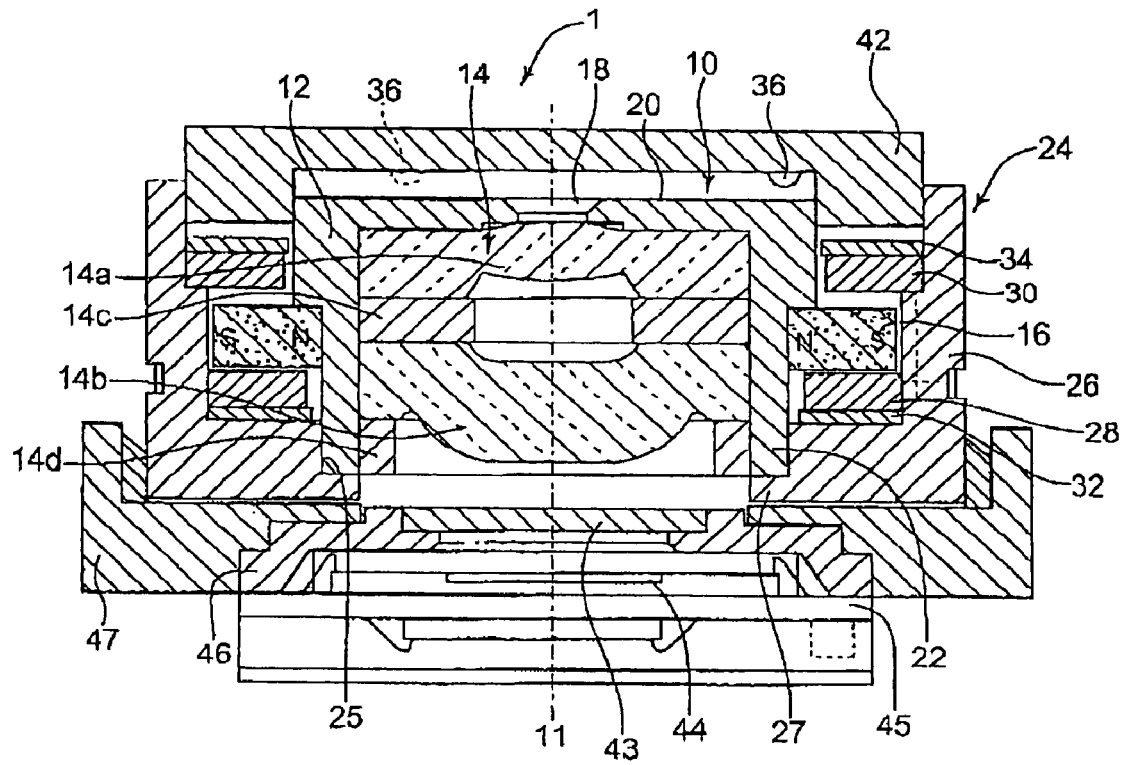
FIG. 1 shows a cross-sectional view of a lens driving device in accordance with a first embodiment of the present invention.

A lens driving device 1 shown in FIG. 1 in accordance with a first embodiment of the present invention is mainly composed of a moving body 10 and a fixed body 24. The moving body 10 includes a generally cylindrical lens-barrel 12 with an optical axis 11 located in its center, and a lens 14 is mounted inside the lens-barrel 12. The lens 14 is a photographing lens of a camera which may be formed from a combination of multiple lenses. The lens 14 includes a subject side lens 14a on the upper side in FIG. 1, and a camera-body side lens 14b on the lower side in FIG. 1.

The outer circumference of the lens-barrel 12 has a larger diameter on the front side (upper side in FIG. 1) and a smaller diameter on the rear side (lower side in FIG. 1) and includes a stepped section at a boundary of the larger diameter section and the smaller diameter section. A drive magnet 16 that is formed in a ring shape is fitted to the smaller diameter section in the rear side of the lens-barrel 12. The drive magnet 16 is placed abutting to the stepped section and affixed to the lens-barrel 12 in one piece. The drive magnet 16 protrudes outward from the outer circumferential surface of the lens-barrel 12 as if it were a flange section of the lens-barrel 12.

In a front end section of the lens-barrel 12, in other words, an end section of the lens-barrel 12 on the subject side, a front end face 20 of the lens-barrel 12 is provided at its center with a circular light incident window 18 for introducing light reflected on subjects to a lens 14. A barrier that can be freely opened and closed for protecting the lens may be provided in front of the light incident window 18, although its illustration is omitted.

The lens-barrel 12 is inserted in the fixed body 24. The fixed body 24 is also formed in a generally cylindrical configuration. A rear end section 22 of the lens-barrel 12 is inserted in a rear end inner circumference 25 of the fixed body 24, wherein the outer circumference of the rear end section 22 is slidably guided by the rear end inner circumference 25 along the optical axis 11 of the lens 14. Movements of the lens-barrel 12 toward the inner side, in other words, toward the camera body inner side, are limited by a protruded edge 27 that protrudes inward at a rear end of a cylindrical section 26 that forms the fixed body 24 when the lens-barrel 12 abuts against the protruded edge 27. FIG. 1 shows therefore a state in which the lens-barrel 12 has moved to the inner most side.

The cylindrical section 26 includes an inner circumference on the front side of the rear end inner circumference 25. The inner circumference of the cylindrical section 26 has an inner diameter greater than the diameter of the rear end inner circumference 25. The drive magnet 16 that moves in a unitary fashion with the lens-barrel 12 is disposed opposite the inner circumference of the cylindrical section 26 across a small gap provided in between. Also, the drive magnet 16 is housed in a manner moveable in the optical axis 11 with respect to the cylindrical section 26. A first drive coil 28 wound in a ring shape is disposed opposite the drive magnet 16 along the inner circumference of the fixed body 24 on the inner side of the drive magnet 16, and a second drive coil 30 is disposed opposite the first drive coil 28 across the drive magnet 16.

A first magnetic member 32 in a ring shape is disposed on the first drive coil 28 on the inner side. The first magnetic member 32 and the first drive coil 28 are affixed together to the cylindrical section 26 of the fixed body 24 with adhesive or the like. As described above, a front end surface of the first drive coil 28 opposes a rear end surface of the drive magnet 16.

A second drive coil 30 wound in a ring shape is disposed opposite the drive magnet 16 along the front end inner circumference of the fixed body 24 on the front side of the drive magnet 16, and a second magnetic member 34 in a ring shape is disposed on the second drive coil 30, which are affixed together to the cylindrical section 26 of the fixed body 24 with adhesive or the like. A front end surface of the drive magnet 16 opposes a rear end surface of the first drive coil 28. In other words, the first magnetic member 32 and the second magnetic member 34 are disposed on outer end surfaces in the optical axis of the respective first drive coil 28 and the second drive coil 30, which are arranged in the optical axis 11 across the drive magnet 16; and the drive magnet 16 is interposed between the first and second drive coils 28 and 30 in the optical axis 11.

The first and second magnetic members are each made of ferromagnetic material in a washer shape, for example, a ring-shaped steel plate. A magnetic flux that goes out the drive magnet 16 passes the first drive coil 28 and the first magnetic member 32 from its center side to its outer circumference side and returns to the drive magnet 16. Also, a magnetic flux that goes out the drive magnet 16 passes the second magnetic member 34 and the second drive coil 30 from its center side to its outer circumference side and returns to the drive magnet 16. The drive magnet 16, the first and second drive coils 28 and 30, and the first and second magnetic members 32 and 34 form magnetic circuits. Accordingly, the first and second drive coils 28 and 30 are located in a magnetic field that is formed by the drive magnet 16.

The distance between opposing faces of the first and second driving coils 28 and 30 is greater than the thickness of the drive magnet 16 in the direction of the optical axis 11, and a gap is created between the drive magnet 16 and the first drive coil 28 or the second drive coil 30, such that the drive magnet 16, in other words, the lens-barrel 12 connected in one piece with the drive magnet 16, can move within the range of the gap in the direction of the optical axis 11.

In the embodiment shown in FIG. 1, the drive magnet 16 together with the lens-barrel 12 moves to a position on the inner side (lower side in the figure), and is retained at the position by a magnetic attraction force working between the drive magnet 16 and the first magnetic member 32 even when the drive coils 28 and 30 are not energized. The position of the lens 14 in this state is at a position where an ordinary photographing takes place (hereafter referred to as an "ordinary photographing position"). At this moment, as indicated in FIG. 1, a small gap is provided between the first drive coil 28 and the drive magnet 16. This small gap is provided to prevent the first drive coil 28 and the drive magnet 16 from colliding each other. If no gap is provided, one or both of the first drive coil 28 and the drive magnet 16 would be damaged when they collide each other.

In the state indicated in FIG. 1, when a macro switch (not shown) is operated to energize at least one of the first and second drive coils 28 and 30 in a predetermined direction, a magnetic force works in a direction to push the drive magnet 16 together with the lens-barrel 12 forward (toward the front side) base on Fleming's left-hand rule by the direction of the current circulating in the coils and the direction of the magnetic field of the drive magnet 16, such that the drive magnet 16 together with the lens-barrel 12 move forward. The amount of forward movement is defined by the range of the gap created between the drive magnet 16 and the first drive coil 28 or the second drive coil 30. As the lens-barrel 12 together with the lens 14 moves forward, a macro photographing becomes possible. It is noted that Fleming's left-hand rule represents the relationship between a magnetic field, a line current circulating in the magnetic field and a force that works on an object that circulates the line current. In the present embodiment, since the drive coils 28 and 30 are both fixed unmovable, a force works on the drive magnet 16 as a counter action.

When the lens-barrel 12 moves forward, its front end face 20 abuts against a buffer material 36 to be described later, and its forward advancing movement is stopped by the buffer material 36. The position of the lens 14 that has been advanced forward and stopped is maintained by a magnetic attraction force generated between the drive magnet 16 and the second magnetic material 34 even though the drive coils 28 and 30 are not energized. In this state, a small gap is provided between the second drive coil 30 and the drive magnet 16 to prevent them from colliding each other and damaging each other.

The electromagnetic force that moves the lens-barrel 12 forward, is generated in a direction to move the drive magnet 16 forward upon energizing the first drive coil 28, and is also generated in a direction to move the drive magnet 16 forward upon energizing the second drive coil 30. Accordingly, the first and second drive coils 28 and 30 may be energized simultaneously, or one of them may be energized to generate the electromagnetic force to move the lens-barrel 12 forward.

In order to prevent an impact force from being generated when the lens-barrel 12 moves forward by the electromagnetic force, the buffer material 36 that is formed from a spring member such as a leaf spring is affixed to a surface of the fixed body 24 opposing the front end face 20 of the lens-barrel 12. The buffer material 36 may be formed as a plurality of protrusions on a surface of a circular pan-shaped cover 42 that forms a part of the fixed body 24, which opposes the moving body 10. The cover 42 transmits light from subjects towards the lens 14, and seals the interior of the lens driving device and thus prevents outside dirt and dust from entering the interior space that encloses the lens 14. The cover 42 is fitted in the cylindrical section 26 of the fixed body 24, and affixed to the cylindrical section 26 by an appropriate means such as adhesive.

A filter 43 is disposed on a rear end member 46 that is affixed to a base section 47 (to be described below) on the inner side of the lens driving device 1 along the optical axis 11. Further, an image capturing element 44 is disposed at a fixed position located more inner side of the filter 43. The filter 43 cuts light with specified wavelengths other than detection wavelengths of the image capturing element 44. The image capturing element 44 may be composed of CMOSs (complementary metal oxide semiconductors), and sends its detected signal to a circuit substrate 45. An image signal, which is the detected signal, is sent through the circuit substrate 45 to a control section (not shown) (which may be composed of a microcomputer or the like).

The circuit substrate 45 may be formed in a size or with an outer diameter smaller than the outer diameter of the cylindrical section 26 that forms the fixed body 24, so that the circuit substrate 45 would not project out from the cylindrical section 26. It is noted that CCD or VMIS may also be used as the image capturing element 44, aside from the COMS.

To switch from the macro photographing position to the ordinary photographing position, the switch position is changed to an ordinary photographing position. By this switching operation, at least one of the first and second drive coils 28 and 30 is energized in the reverse direction, and a magnetic force works in a direction to pull the drive magnet 16 rearward (toward the inner side) based on Fleming's left-hand rule by the direction of the current circulating in the coils and the direction of the magnetic field of the drive magnet 16, such that the drive magnet 16 together with the lens-barrel 12 moves rearward, and assumes the ordinary photographing position indicated in FIG. 1.

An example of dimension data of the first embodiment in FIG. 1 is as follows: the outer diameter of the cylindrical section 26 of the fixed body 24 is 10.5 mm, the height of the cylindrical section 26 is 5.5 mm, and the moving stroke of the lens barrel 12 is approximately 0.2 mm. Both of the lenses 14a and 14b may preferably be aspherical lenses, as indicated in FIG. 1, and may be formed from resin. The minimum drive time to apply current to the first drive coil 28 and/or the second drive coil 30 to switch between the macro photographing position and the ordinary photographing position is 5 msec.

As described above, the cylindrical section 26 and the cover 42 serve as constituent members of a frame for the fixed body 24 in the lens driving device 1 of the first embodiment. The cylindrical section 26 is affixed by adhesive to the base section 47, on which is mounted and held the rear end member 46, which in turn holds the filter 43 and the image capturing element 44. Consequently, according to the present embodiment, the rear end member 46 and the base section 47 also form a part of the fixed body 24.

The first embodiment shown in FIG. 1 is a moving magnet type configuration, in which the drive magnet 16 is placed on the moveable side and the drive coils 28 and 30 are placed on the fixed side. However, the lens driving device may be a moving coil type, in which a drive coil is placed on the movable side and drive magnets are placed on the fixed side.

For example, a moving body 10 may comprise a drive coil and a magnetic member that are movable along with a lens 13 in the direction of an optical axis 11, while a fixed body 24 comprises a first drive magnet and a second drive magnet placed in the direction of the optical axis 11 of the lens 13 to interpose the drive coil in between and further forms a magnetic circuit with the drive magnet. When energization of the drive coil is stopped, the magnetic attraction between either the first drive magnet or the second drive magnet and the magnetic member causes the moving body to be held in a predetermined position, and the energization of the drive coil causes the moving body 10 to move between the first drive magnet and the second drive magnet. A flexible lead wire may have to be used in order to energize the movable drive coil, but no special lead wires are required since, as described earlier, a moving stroke of approximately 0.2 mm is sufficient for lens driving devices applied to cameras mounted on portable equipment.

In the first embodiment shown in FIG. 1, the flow of the magnetic flux from the drive magnet 16 to the first drive coil 28 and/or the second drive coil 30 is required only to be a directional component in the first drive coil 28 and/or the second drive coil 30 that is required to drive the drive magnet 16. Consequently, the drive magnet 16 can be disposed either more inward than the inner diameter of the drive coils or more outward than the outer diameter of the drive coils.

Figure 2:
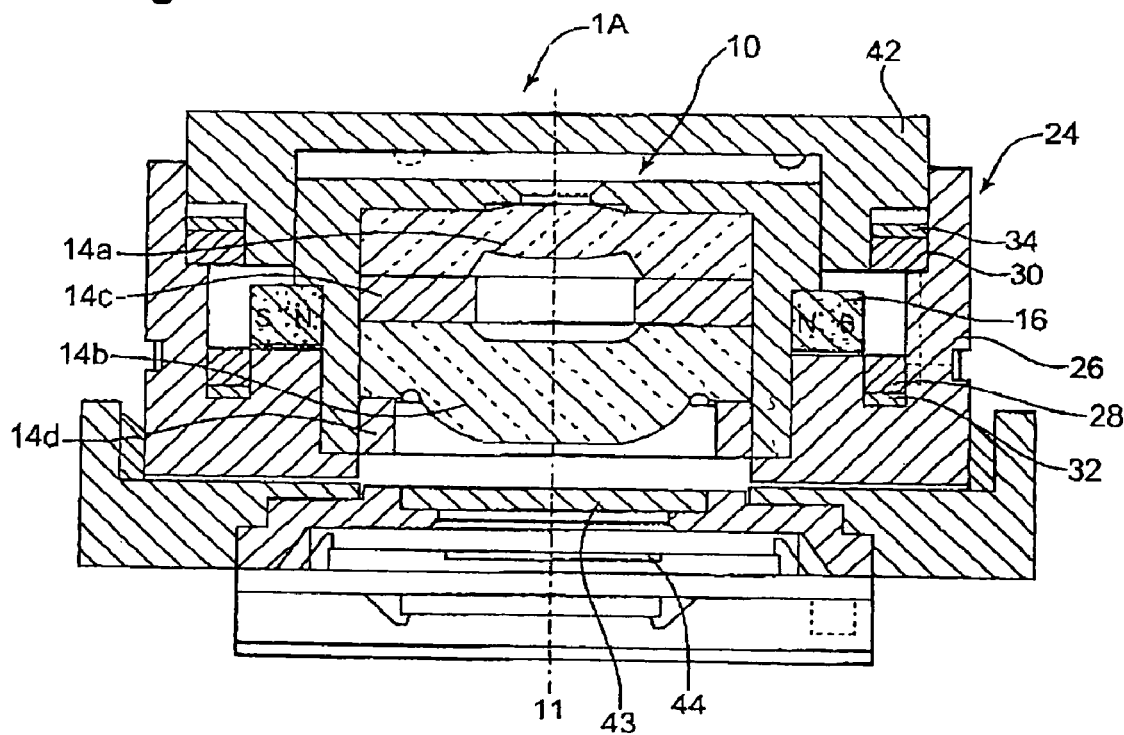
FIG. 2 shows a cross-sectional view of a lens driving device in accordance with a second embodiment of the present invention.

FIG. 2 shows a lens driving device 1A in accordance with a second embodiment of the present invention. Components of the lens driving device 1A similar to those of the first embodiment shown in FIG. 1 are assigned the same reference numbers. In the example shown in FIG. 2, a drive magnet 16 is disposed inside an inner diameter of either a drive coil 28 or a drive coil 30. In the second embodiment, about one half of the radial length on the outer side of the drive magnet 16 of the first embodiment is removed, and about one half of the radial length on the inner side of each of the drive coils 28 and 30 is removed.

Figure 3:
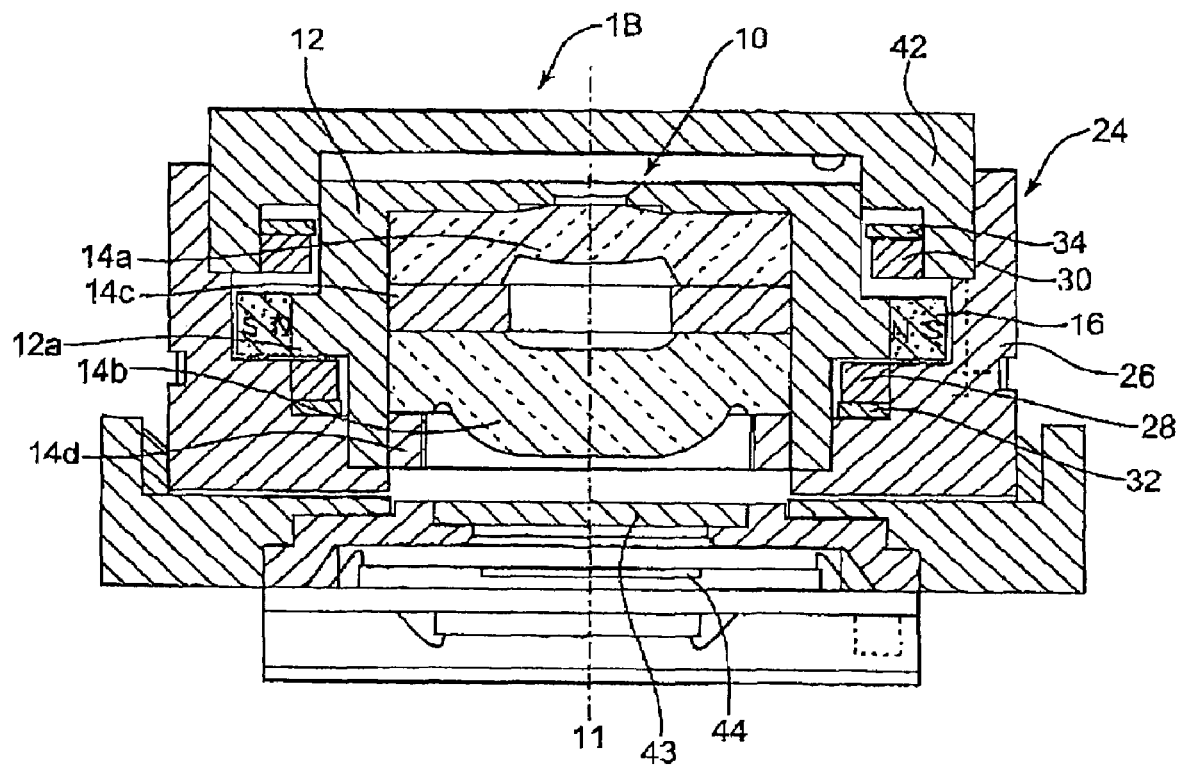
FIG. 3 shows a cross-sectional view of a lens driving device in accordance with a third embodiment of the present invention.

FIG. 3 shows a lens driving device 1B in accordance with a third embodiment of the present invention. In the example shown in FIG. 3, a drive magnet 16 is disposed outside an outer diameter of a drive coil 28 or a drive coil 30. As shown in FIG. 3, a lens-barrel 12 is provided in one piece with a circular flange section 12a formed generally in a middle of the lens-barrel 12 in the optical axis 11, and the drive magnet 16 is affixed to an outer circumferential surface of the flange section 12a. An outer diameter of the first drive coil 28 and an inner diameter of the drive magnet 16 are generally the same, and an inner diameter of the drive magnet 16 is located within the width of the second drive coil 30 defined between an inner diameter and an outer diameter of the second drive coil 30.

Like the first embodiment shown in FIG. 1, the first magnetic member 32 and the second magnetic member 34 are generally in a flat plate shape. However, in order to adjust the attraction force between the drive magnet 16 and these magnetic members, the shape of the first and second magnetic members may be modified. Also, like the first embodiment shown in FIG. 1, the first magnetic member 32 and the second magnetic member 34 are generally provided with the same configuration and the same area in consideration of the balance of attraction forces that work when the lens 14 is on the standard side (i.e., ordinary photographing position) and on the macro side. However, the first magnetic member 32 and the second magnetic member 34 may be provided with mutually different configurations and/or areas in view of specifications required and influences of magnetic circuits such as leak magnetic flux.

Figure 4:
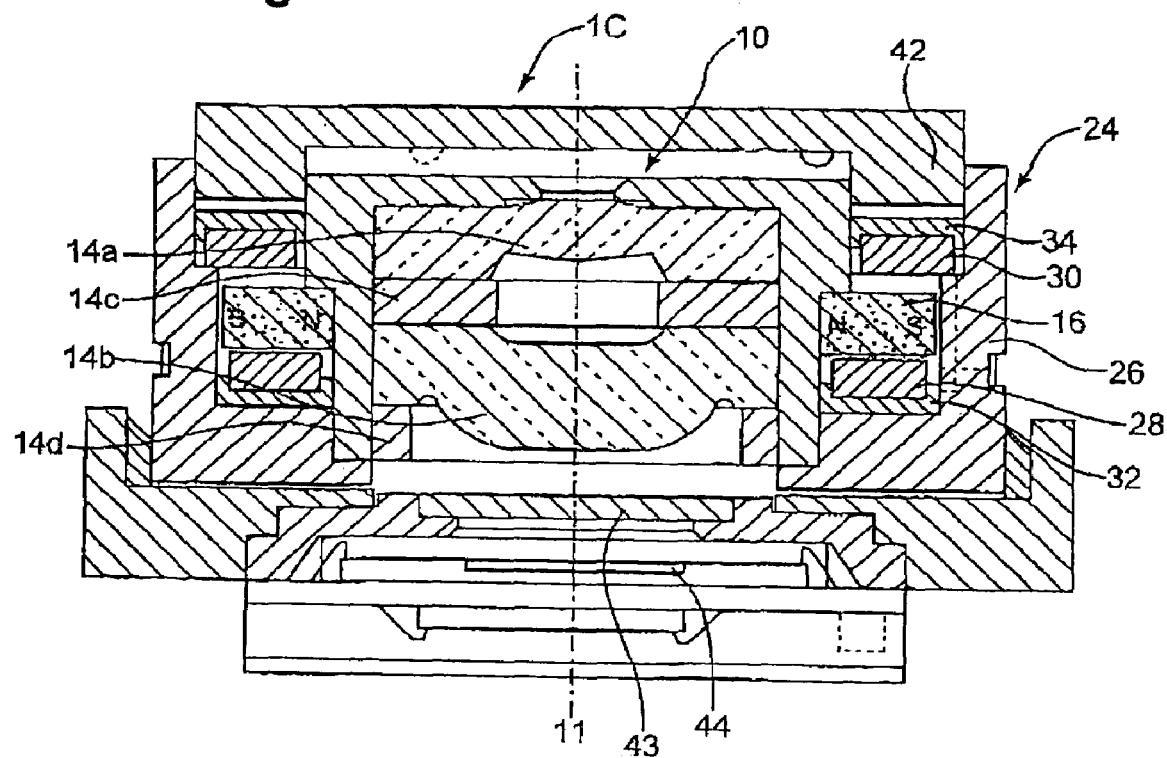
FIG. 4 shows a cross-sectional view of a lens driving device in accordance with a fourth embodiment of the present invention.

FIG. 4 shows a lens driving device 1C in accordance with a fourth embodiment of the present invention. In this embodiment example, a first magnetic member 32 and a second magnetic member 34 are each provided with a channel-shaped cross section. The magnetic member 32 and the second magnetic member 34 are fitted on a first drive coil 28 and a second drive coil 30, respectively, in a manner that openings of the channel-shaped cross sections oppose each other.

Figure 5:
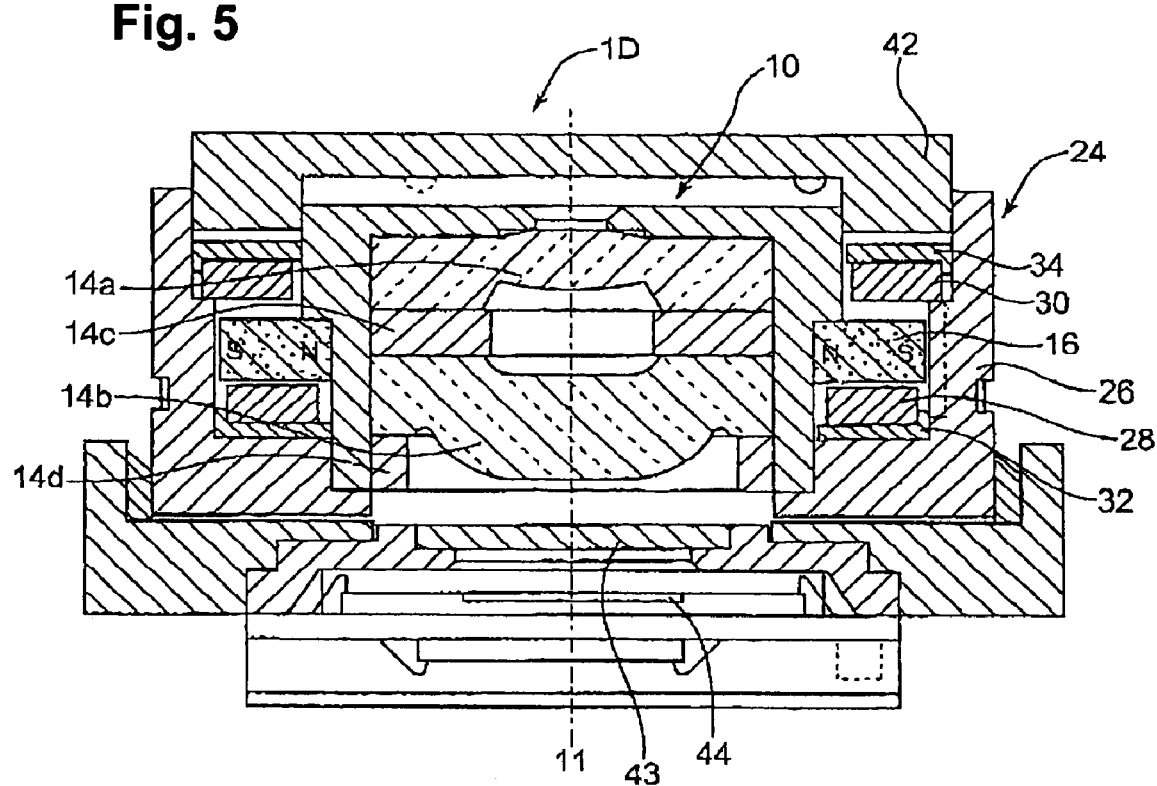
FIG. 5 shows a cross-sectional view of a lens driving device in accordance with a fifth embodiment of the present invention.

FIG. 5 shows a lens driving device 1D in accordance with a fifth embodiment of the present invention, in which a first magnetic member 32 and a second magnetic member 34 each have an L letter-shaped cross section.

In the first through fifth embodiments described above, the drive magnet 16 and the drive coils 28 and 30 are disposed in a manner to overlap one another in the optical axis direction, and the drive magnet 16 is moved linearly in the optical axis 11. Even when the drive coils 28 and 30 do not operate due to a problem such as breaking of coil wires of the drive coils 28 and 30, the lens can be moved to a retaining position by a force such as a centrifugal force or an inertial force, which may be generated, for example, by shaking the camera by hand, such that the lens can be retained at the retaining position by the magnetic attraction force between the magnet and the magnetic member. In other words, even when the electrical control cannot be performed due to a problem, such as, breaking of coil wires, lowered battery power, or the like, the position of the lens 14 can be changed by a mechanical force, and the worst case of inoperability can be avoided.

Figure 6:
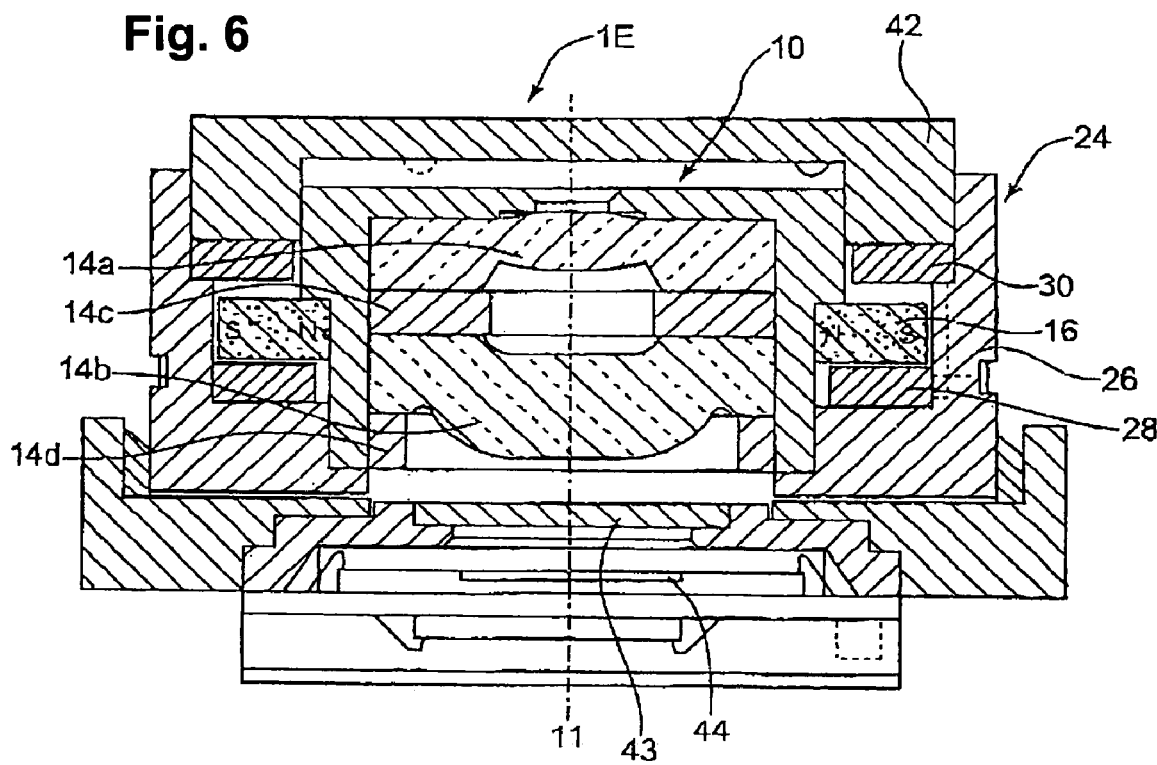
FIG. 6 shows a cross-sectional view of a lens driving device in accordance with a sixth embodiment of the present invention.

FIG. 6 shows a lens driving device 1E in accordance with a sixth embodiment of the present invention, in which first and second magnetic members are not provided. The lens driving device 1E shown in FIG. 6 is generally the same as the lens driving device 1 in the first embodiment shown in FIG. 1 except that the first magnetic member 32 and the second magnetic member 34 are not provided. The sixth embodiment example shown in FIG. 6 may need to energize the drive coil 28 or the drive coil 30 in order to retain the lens 14 at the standard side which is an ordinary photographing position or the macro side which is a macro photographing position. However, the lens driving device 1E shown in FIG. 6 has several advantages. For example, the drive magnet 16 can be driven with good linearity, and the lens 14 can be stopped anywhere between the standard position and the macro position, such that the lens driving device 1E can be readily provided with additional functions such as auto-focusing and zooming.

Figure 7:
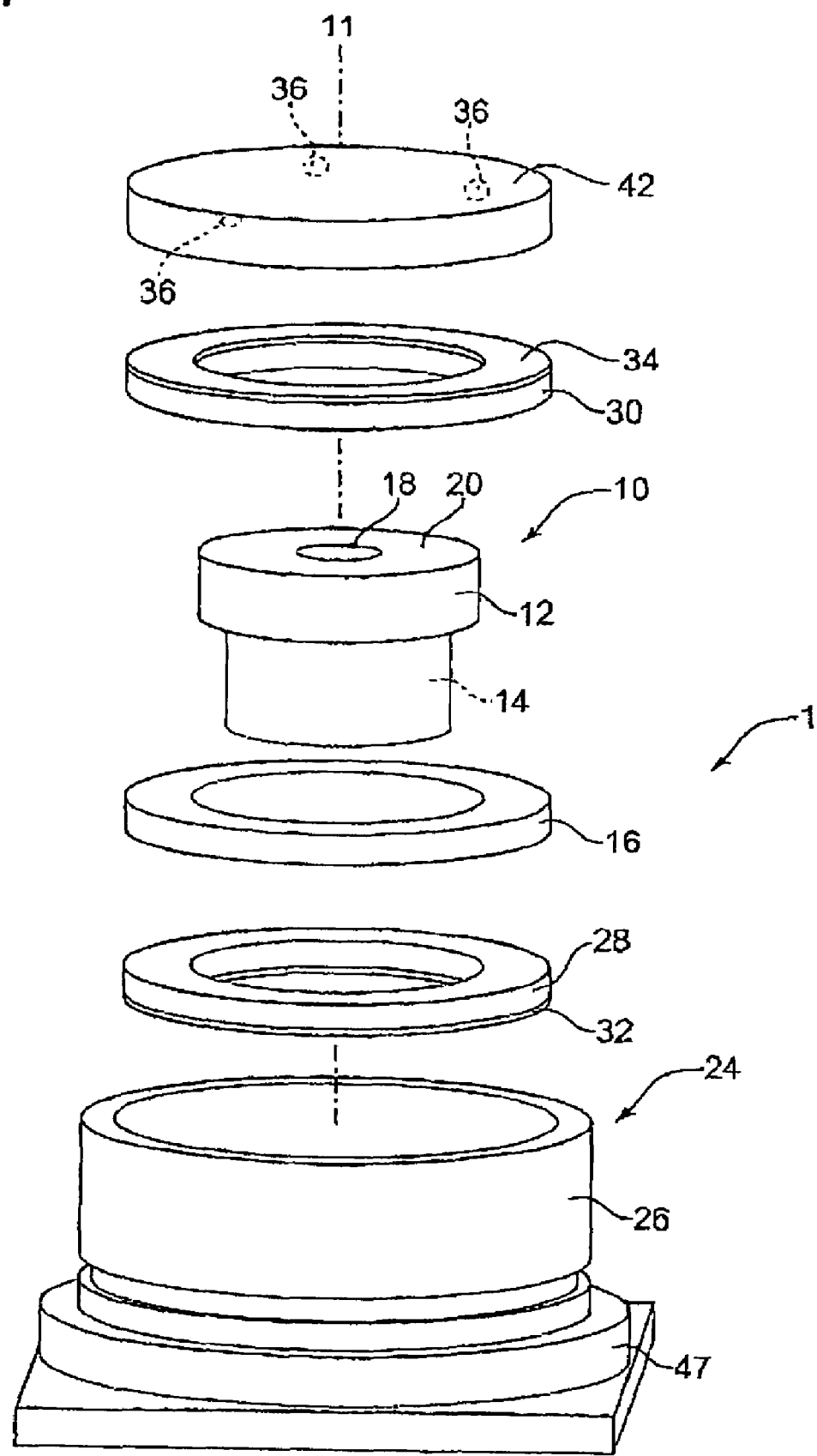
FIG. 7 shows an exploded perspective view of the lens driving device shown in FIG. 1.

Next, a method of assembling the lens driving device 1 in accordance with the first embodiment of the present invention will be described with reference to FIG. 1 and FIG. 7. It is noted that generally the same assembling method can be used for the lens driving devices 1A-1E and other lens driving devices in accordance with other embodiments to be described below.

First, the rear end member 46, which includes the image capturing element 44, the circuit substrate 45 and the filter 43, is fitted and fixed to the base section 47. In the mean time, the first magnetic member 32 is inserted in and fixed to the cylindrical section 26 of the fixed body 24. Next, the first drive coil 28 is disposed on top of and affixed to the first magnetic member 32. Then, the moving body 10 with the drive magnet 16 affixed thereto and the lens 14 mounted therein is inserted in the cylindrical section 26.

Then, the second drive coil 30 is inserted in and fixed to the cylindrical section 26, and then the second magnetic member 34 is disposed on top of and affixed to the second drive coil 30. Next, the cover 42 is fitted in and temporarily affixed to the cylindrical section 26. In this state, the cylindrical section 26 is inserted in the base section 47, the distance between the image capturing element 44 and the lens 14 is adjusted such that the lens 14 can provide a proper image at the ordinary photographing position. In this state, adhesive is injected in gaps between the base section 47 and the cylindrical section 26 to affix them together.

Next, the cover 42 is moved forward and rearward in the direction of the optical axis 11 to find a position where the lens 14 can enable an appropriate photographing at a macro photographing position, and affix the cover 42 at such a position. In other words, the cover 42 is moved forward and rearward in the direction of the optical axis 11 with respect to the cylindrical section 26 in order that a proper macro image can be obtained at the macro photographing position at which the front end face 20 of the lens-barrel 12 is in contact with the buffer material 36, and the cover 42 is affixed to the cylindrical section 26 with adhesive at an appropriate position. The buffer material 36 may preferably be provided at three locations at 120 degree intervals, as indicated in FIG. 7.

Figure 8:
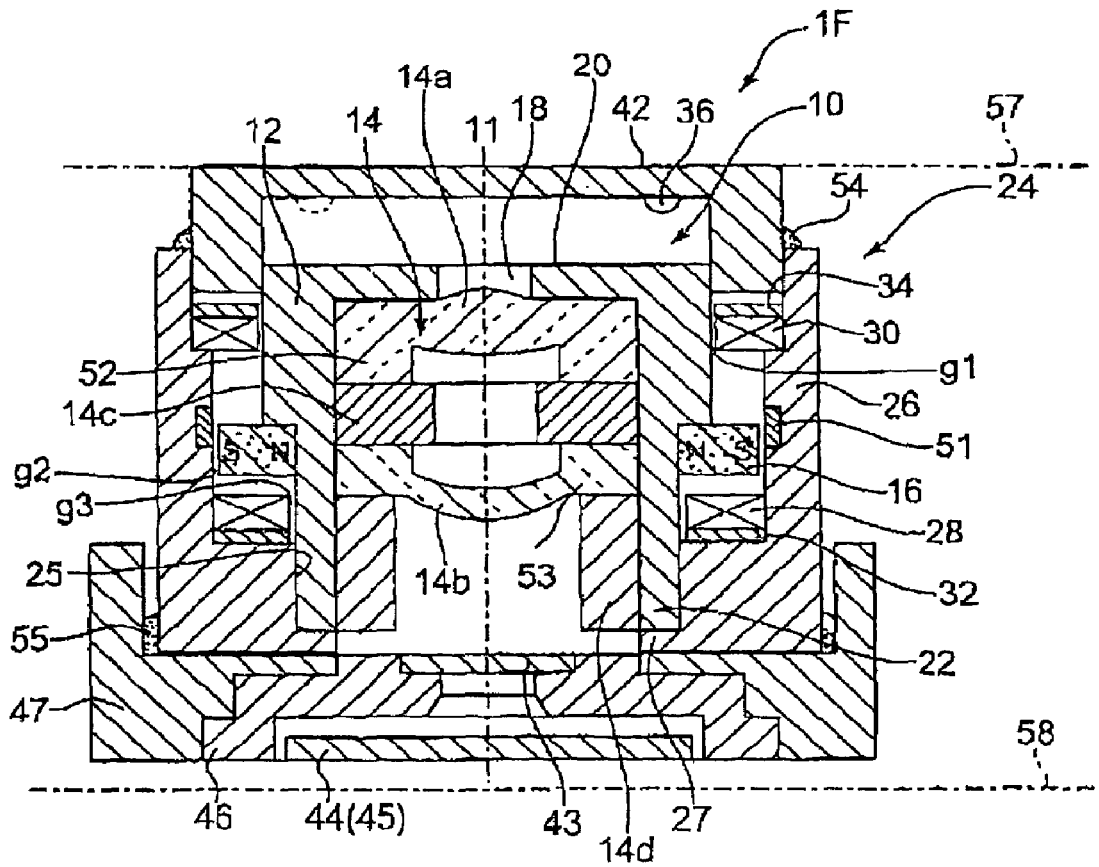
FIG. 8 shows a cross-sectional view of a lens driving device in accordance with a seventh embodiment of the present invention.

FIG. 8 shows a lens driving device 1F in accordance with a seventh embodiment of the present invention. The lens driving device 1F has basically the same structure as that of the lens driving device 1. Accordingly, like components are assigned the same reference numbers and their detailed description is omitted, and only different features are mainly described.

The lens driving device 1F is provided with a third magnetic member 51 in a ring shape disposed between a first drive coil 28 and a second drive coil 30, such that a drive magnet 16 can be stopped and retained midway while the drive magnet 16 is moved between the first drive coil 28 and the second drive coil 30, in other words, a step-driving at three positions is made possible. As a more specific example, in addition to the two locations of ordinary photographing position and macro photographing position, another photographing position midway between the two positions is provided at which fine images of subjects at a distance of about 3 m from the lens driving device 1F can be captured. Instead of a single third magnetic member 51, a plurality of third magnetic members may be provided to enable a step-driving at four or more positions.

A lens 14 of the lens driving device 1F is composed of a lens 14a on the object side and a lens 14b on the camera body side, like the embodiments described above. The lens 14a on the object side is an aspherical lens of resin formed in one piece with a frame section 52, and the lens 14b on the camera body side is also an aspherical lens of resin formed in one piece with a frame section 53. The cover 42 and the cylindrical section 53 are affixed together with adhesive material 54, and the cylindrical section 53 and the base section 47 are affixed together with adhesive material 55.

Also, like the other embodiments, a gap g1 is formed between an outer circumference of the lens-barrel 12 and an inner circumference of each of the second drive coil 30 and the second magnetic member 34, a gap g2 is formed between an outer circumference of the drive magnet 16 and an inner circumference of the cylindrical section 26, and a gap g3 is formed between an outer circumference of the lens-barrel 12 and an inner circumference of each of the first drive coil 28 and the first magnetic member 32. In the lens driving device 1F, the gaps g1, g2 and g3 have relations of g3>g2 and g3>g1. Also, the gaps g1 and g2 may preferably have a relation of g2>g1.

Also, the lens driving device 1F is disposed in portable equipment such as a portable telephone, such that a case front surface 57 of the portable telephone is flush or generally flush with a surface of the cover 42. Further, the image capturing element 44 and the circuit substrate 45 are disposed between a case rear surface 58 of the portable telephone and the lens 14. As a result, an ample space can be provided in an area around the outer circumference of the lens driving device 1F, such that the lens driving device 1F can be readily assembled in the portable equipment. The case front surface 57 and the case rear surface 58 are omitted in the other figures, but have the same positional relation as that shown in FIG. 8. Furthermore, the drive magnet 16 is formed in a ring shape like the other embodiments (see FIG. 7 and FIG. 9) and has a center hole 16a, and an inner section of the drive magnet 16 surrounding the center hole 16a is magnetized with a single pole of N pole and an outer circumference section of the drive magnet 16 is magnetized with a single pole of S pole. It is noted that the inner and outer circumference sections may be magnetized such that the N and S poles have an inverted magnetization relation.

Figure 10:
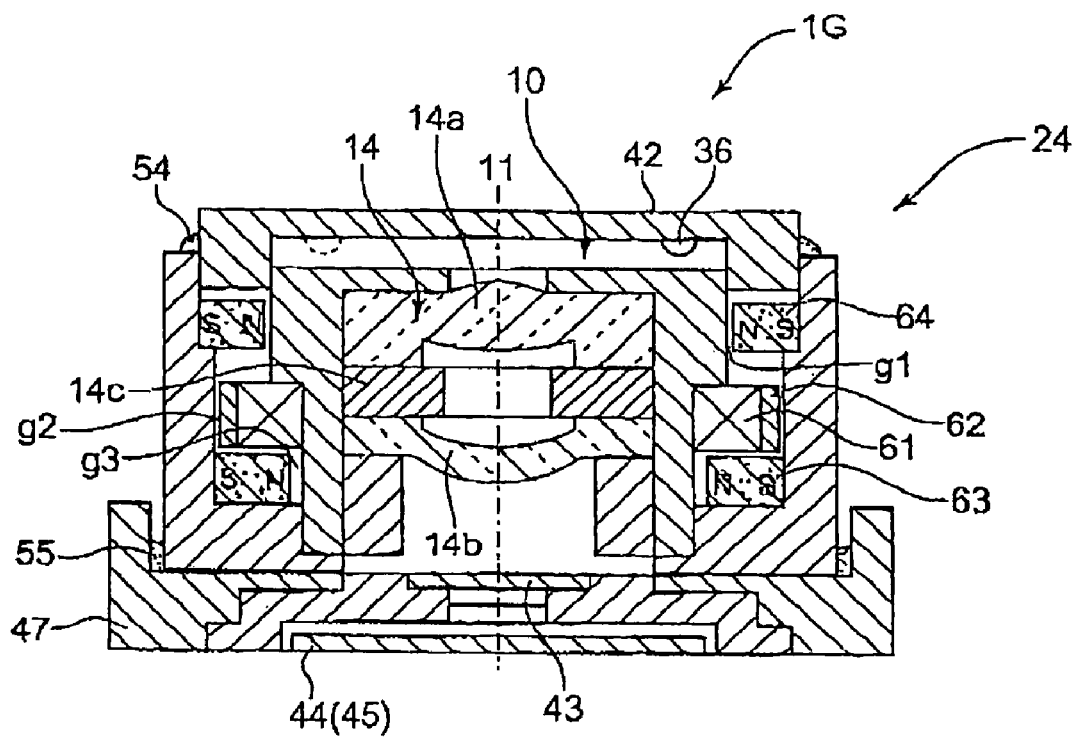
FIG. 10 shows a cross-sectional view of a lens driving device in accordance with an eighth embodiment of the present invention.

Next, a lens driving device 1G in accordance with an eighth embodiment of the present invention will be described with reference to FIG. 10. The lens driving device 1G is structured generally based on the same principle as that of the lens driving device 1. Accordingly, like components are assigned the same reference numbers and their detailed description is omitted, and only different features are mainly described.

Figure 9:
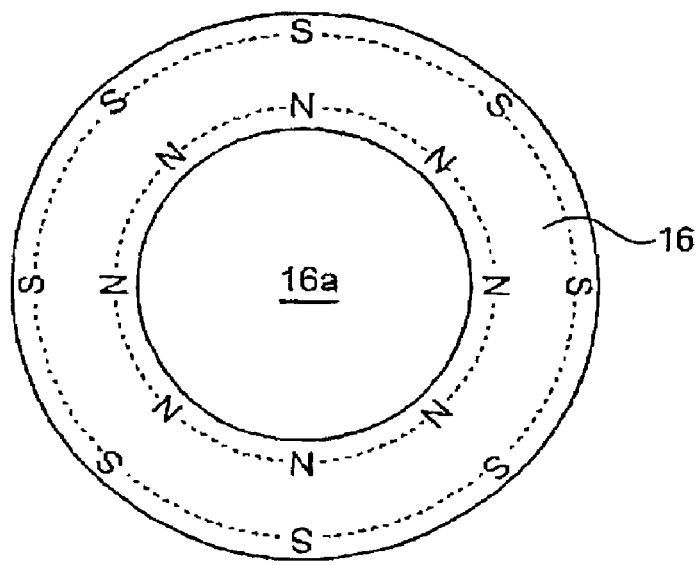
FIG. 9 shows a plan view of a drive magnet that is used in each of the lens driving devices.

The lens driving device 1G has a structure that is inverse of the structure of the first to seventh lens driving devices 1 and 1A-1F. More specifically, the lens driving device 1G has a structure in which a ring-shaped drive coil 61 that is wound in a circle and a ring-shaped magnetic member 62 are provided on a moving body 10 that is a moveable side, and a first drive magnet 63 and a second drive magnet 64 are disposed on a fixed body 24 that is a fixed side. The magnetic member 62 in the lens driving device 1G is disposed on an outer diameter side in a radial direction of the drive coil 61. However, the magnetic member 62 may be disposed on an inner diameter side in the radial direction of the drive coil 61. Also, each of the first drive magnet 63 and the second drive magnet 64 may be a ring-shaped magnet that is magnetized as indicated in FIG. 9. It is noted that both of the first drive magnet 63 and the second drive magnet 64 may be magnetized such that the N and S poles have an inverted magnetization relation. In this case, the direction of magnetization of the drive coil 61 is inverted. The magnetization in a reverse direction would also apply to the other embodiments if the magnetization relation of S and N poles is inverted.

Figure 11:
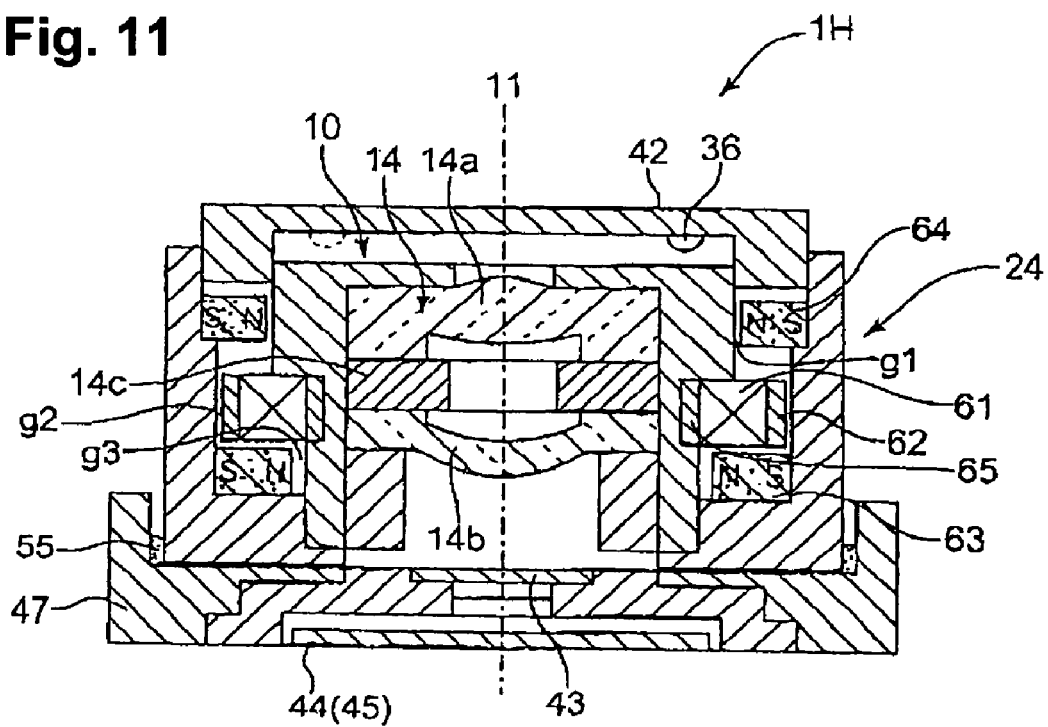
FIG. 11 shows a cross-sectional view of a lens driving device in accordance with a ninth embodiment of the present invention.

Next, a lens driving device 1H in accordance with a ninth embodiment of the present invention will be described with reference to FIG. 11. The lens driving device 1H has basically the same structure as that of the lens driving device 1. Accordingly, like components are assigned the same reference numbers and their detailed description is omitted, and only different features are mainly described.

While the lens driving device 1G in accordance with the eighth embodiment has a single magnetic member, i.e., the single magnetic member 62 disposed on the moving body 10, the lens driving device 1H further includes a second magnetic member 65 in a ring shape in addition to a magnetic member 62, which are disposed in a manner to sandwich a drive coil 61 in a radial direction. The two magnetic members 62 and 65 provide a stronger position retaining force.

Figure 12:
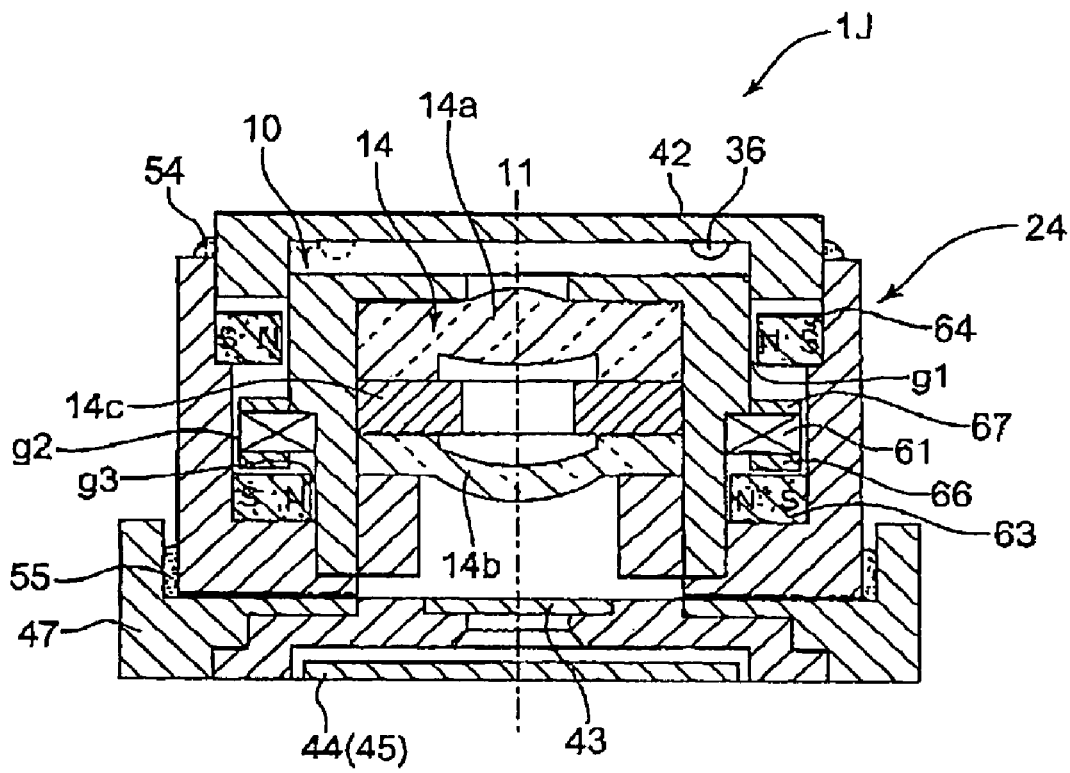
FIG. 12 shows a cross-sectional view of a lens driving device in accordance with a tenth embodiment of the present invention.

Next, a lens driving device 1J in accordance with a tenth embodiment of the present invention will be described with reference to FIG. 12. The lens driving device 1J has basically the same structure as that of the lens driving device 1 or the lens driving device 1H. Accordingly, like components are assigned the same reference numbers and their detailed description is omitted, and only different features are mainly described.

While the lens driving device 1H of the ninth embodiment includes the two magnetic members 62 and 52 provided in the radial direction, the lens driving device 1J of the tenth embodiment includes magnetic members 66 and 67 disposed on upper and lower surfaces of the ring-shaped drive coil 61 in the axial direction. The magnetic members 66 and 67 are each formed in a ring shape and in a flat plate shape. As a result, the magnetic members 66 and 67 provide greater opposing areas with the magnets 63 and 64, and therefore the tenth embodiment provides a greater advantage in view of the position retaining force.

Figure 13:
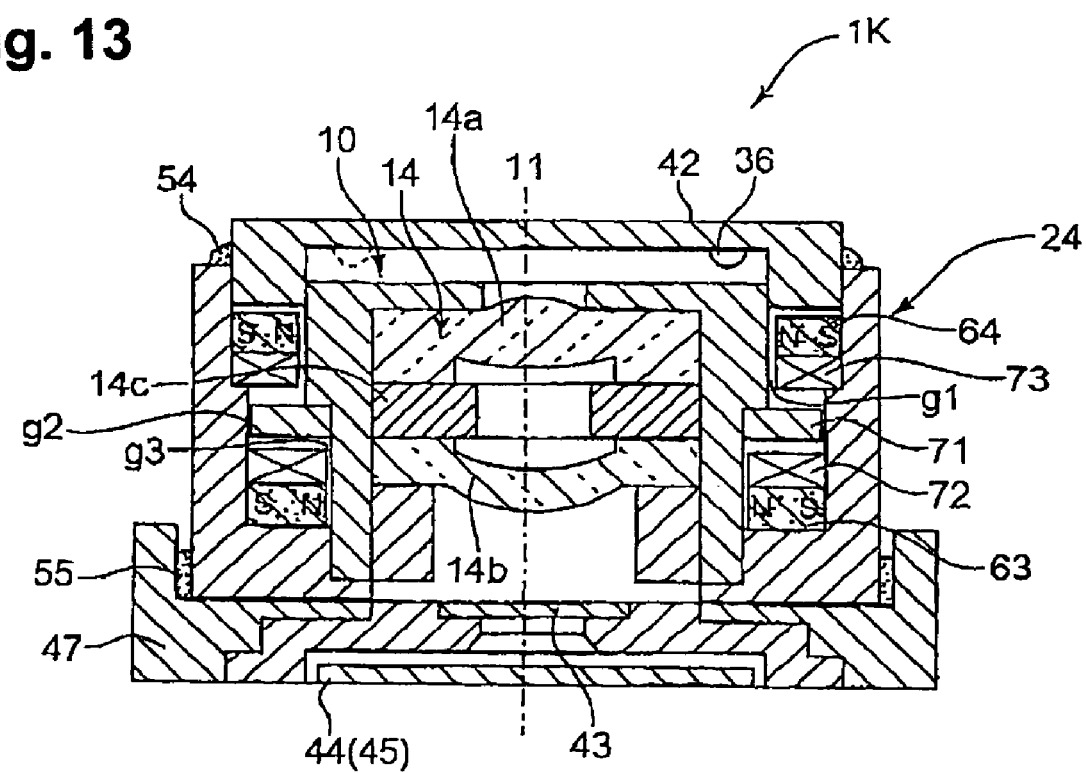
FIG. 13 shows a cross-sectional view of a lens driving device in accordance with an eleventh embodiment of the present invention.

Next, a lens driving device 1K in accordance with an eleventh embodiment of the present invention will be described with reference to FIG. 13. The lens driving device 1K is structured basically on the same principle as that of the lens driving device 1. Accordingly, like components are assigned the same reference numbers and their detailed description is omitted, and only different features are mainly described.

The lens driving device 1K includes a magnetic member 71 in a flat plate shape and in a ring shape disposed on a moving body 10 that is a moving section, and a pair of a first ring-shaped drive magnet 63 and a ring-shaped first drive coil 72 wound in a circle and a pair of a second ring-shaped drive magnet 64 and a ring-shaped second drive coil 73 wound in a circle which are disposed on a fixed body 24 that is a fixed section. The magnetic member 71 is interposed between the two pairs of the drive coils and drive magnets.

In the lens driving device 1K, the first drive coil 72 and the second drive coil 73 cause a difference in magnetic fluxes that circulate from the first drive magnet 63 and the second drive magnet 64 to the magnetic member 71 to thereby move the moving body 10 in the optical axis 11.

Figure 14:
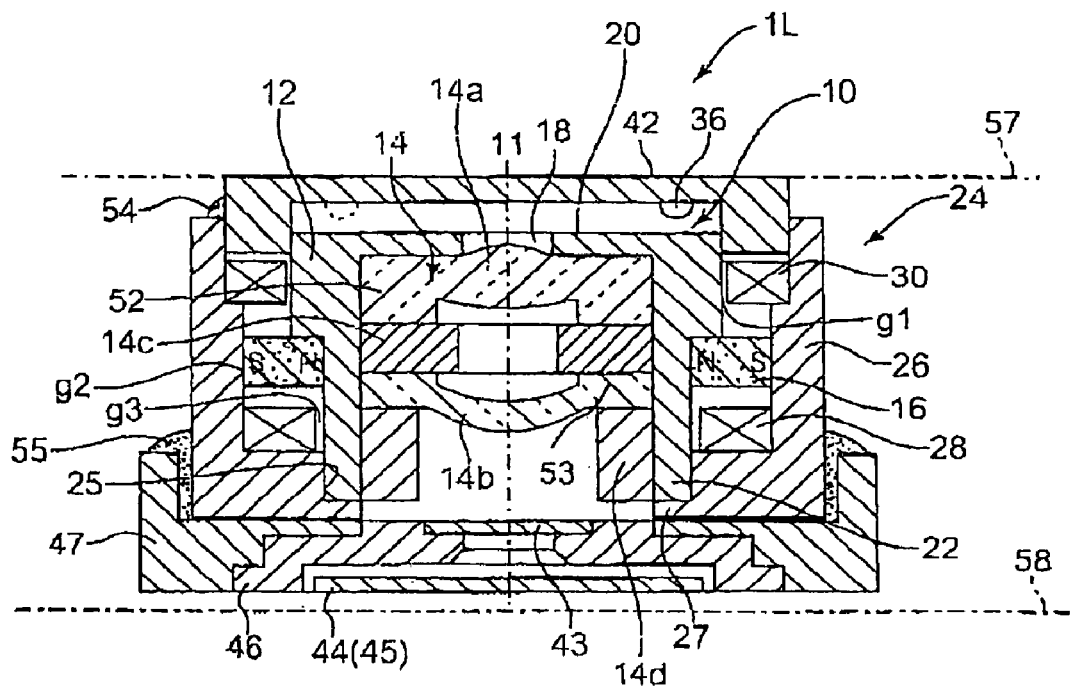
FIG. 14 shows a cross-sectional view of a lens driving device in accordance with a twelfth embodiment of the present invention.

Next, a lens driving device 1L in accordance with a twelfth embodiment of the present invention will be described with reference to FIG. 14. The lens driving device 1L has basically the same structure as that of the lens driving device 1. Accordingly, like components are assigned the same reference numbers and their detailed description is omitted, and only different features are mainly described.

The lens driving device 1L retains a position of a moving body 10, in other words, a drive magnet 16 by frictional force caused by an outer circumferential surface of the drive magnet 16 and an inner circumferential surface of a cylindrical section 26 which are substantially in contact with each other. In other words, the lens driving device 1L does not have a gap g2 between the outer circumferential surface of the drive magnet 16 and the inner circumferential surface of the cylindrical section 26, or a gap g2 is filled with viscous fluid. To adjust the frictional force, material in solid state or liquid state may be coated on the inner circumferential surface of the cylindrical section 26 or on the outer circumferential surface of the drive magnet 16, or may be filled in a gap between the inner circumferential surface of the cylindrical section 26 and the outer circumferential surface of the drive magnet 16.

Figure 15:
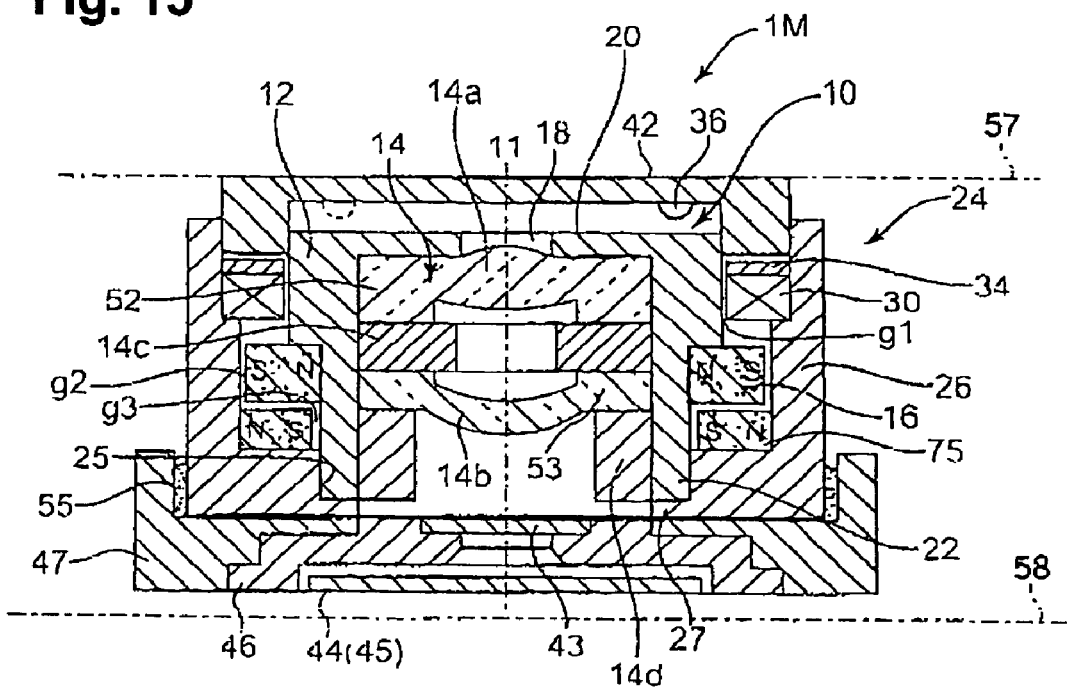
FIG. 15 shows a cross-sectional view of a lens driving device in accordance with a thirteenth embodiment of the present invention.

Next, a lens driving device 1M in accordance with a thirteenth embodiment of the present invention will be described with reference to FIG. 15. The lens driving device 1M has basically the same structure as that of the lens driving device 1. Accordingly, like components are assigned the same reference numbers and their detailed description is omitted, and only different features are mainly described.

The lens driving device 1M includes a ring-shaped fixed magnet 75, which replaces the first drive coil 28 and the first magnetic member 32 on the lower side (inner side) of the lens driving device 1 of the first embodiment. In this example, the fixed magnet 75 is magnetized with polarities opposite to those of a drive magnet 16, such that the fixed magnet 75 and the drive magnet 16 attract each other. However, the fixed magnet 75 and the drive magnet 16 may be magnetized with the same polarities, such that they repel each other. The drive magnet 16, i.e., the moving body 10 can be moved by turning the second drive coil 30 on or off, or switching the direction of current.

It is noted that the second driving coil 30 and the second magnetic member 34 on the upper side (object side) of the lens driving device 1 of the first embodiment may be replaced with a ring-shaped fixed magnet 75. Also, the magnetic member 32 and 34 may be in a channel shape like the fourth embodiment or an L-letter shape like the fifth embodiment. Furthermore, the lens driving device 1 can be similarly driven if the ring-shaped fixed magnet 75 is replaced with a magnetic member.

Figure 16:
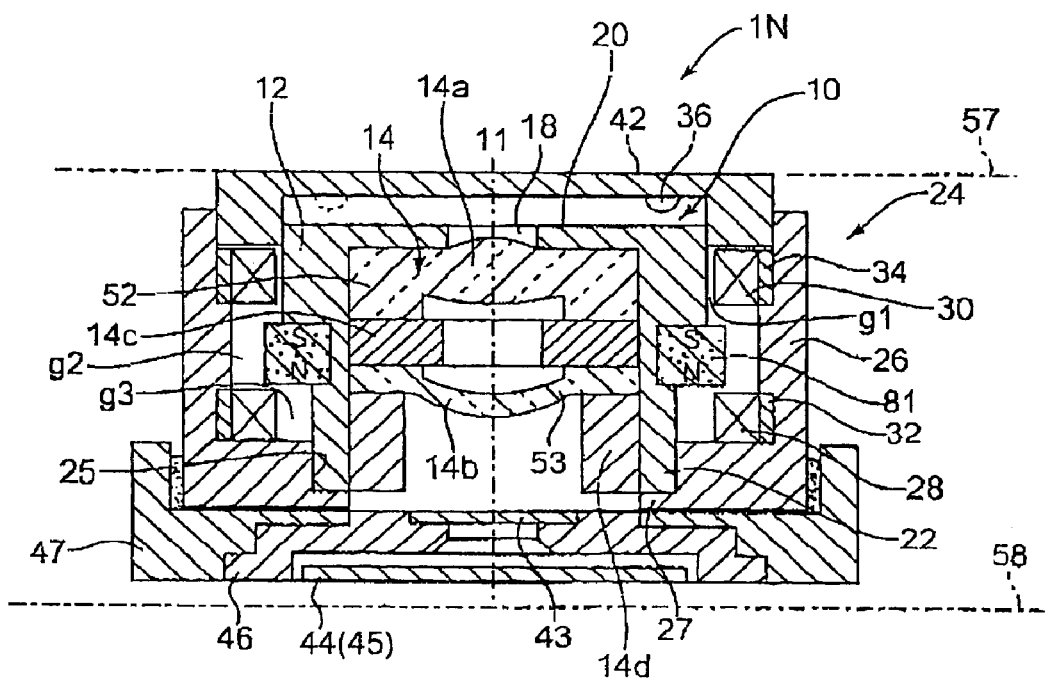
FIG. 16 shows a cross-sectional view of a lens driving device in accordance with a fourteenth embodiment of the present invention.

Next, a lens driving device 1N in accordance with a fourteenth embodiment of the present invention will be described with reference to FIG. 16. The lens driving device 1N operates based on basically the same principle as that of the lens driving device 1. Accordingly, like components are assigned the same reference numbers and their detailed description is omitted, and only different features are mainly described.

The lens driving device 1N includes a drive magnet 81 that is magnetized with N and S poles in an axial direction and affixed to a moving body 10. A magnetic flux of the drive magnet 81 goes out in a direction parallel with the optical axis 11, and flows in a direction perpendicular to the optical axis 11 and passes the first driving coil 28. Then, after passing a ring-shaped first magnetic member 32 and a ring-shaped second magnetic member 34, the magnetic flux passes the second driving coil 30 in a direction perpendicular to the optical axis 11, and then returns as a stream parallel with the optical axis 11 to the drive magnet 81.

In this manner, the magnetic flux of the drive magnet 81 needs to be oriented in a direction perpendicular to the optical axis 11 at both of the first driving coil 28 and the second driving coil 30. For this reason, both of the driving coils 28 and 30 are disposed at places above and below and diagonally offset from the drive magnet 81. As a result, gaps g2 and g3 are substantially large. It is noted that the drive magnet 81 may be magnetized with N and S poles in an inverted polarity relationship compared to that shown in FIG. 16.

Figure 17:
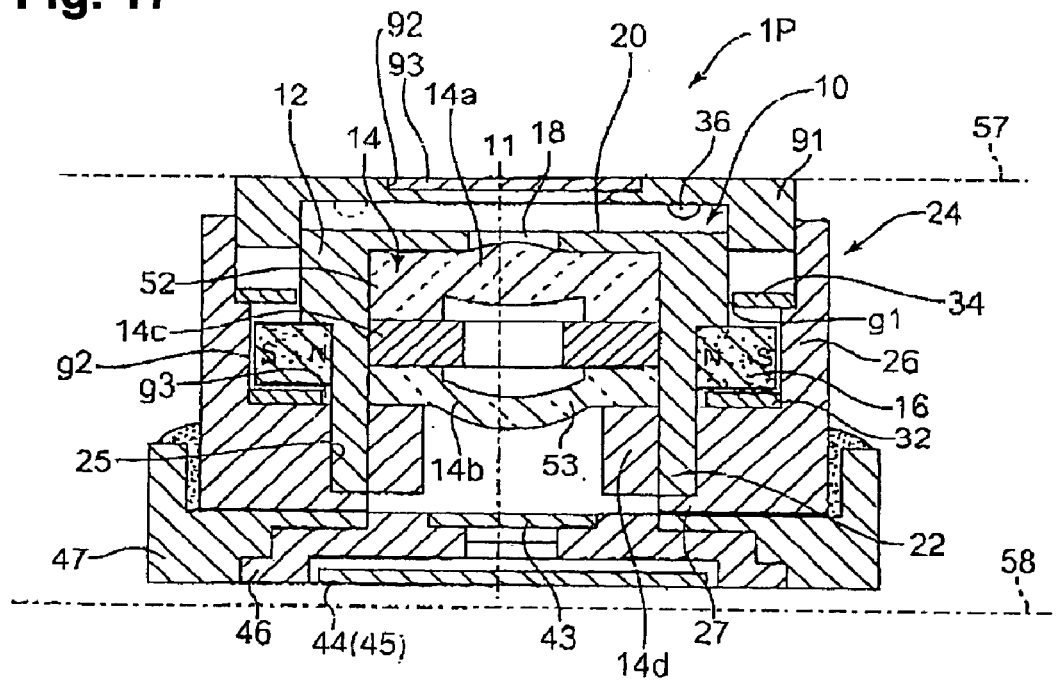
FIG. 17 schematically shows a cross-sectional view of a lens driving device representative of each of the embodiments, which is used to describe advantages of the lens driving device of each of the embodiments.

A lens driving device 1P in accordance with another embodiment will be described with reference to FIG. 17. The lens driving device 1P shown in FIG. 17 has a relatively simplified structure compared to those in the other embodiments described above. The lens driving device 1P has basically the same structure as that of the lens driving device 1. Accordingly, like components are assigned the same reference numbers and their detailed description is omitted, and only different features are mainly described.

The lens driving device 1P can be operated by hand. For example, a portable device equipped with the lens driving device 1P (e.g., a portable telephone with camera) may be held by hand, and shaken by hand for switching from a macro photographing to an ordinary photographing and vice verse. Such manual operation is equally applicable to the other embodiments described above.

The lens driving device 1P does not have drive coils, and therefore a moving body 10 is not electrically driven. Instead, the moving body 10 is moved by an application of a mechanical force, which may be caused by an external force. For example, the lens driving device 1P may be shaken by hand to move a drive magnet 16 to be magnetically attracted to one of ring-shaped, plate-like magnetic members 34 and 32 that are provided above and below the drive magnet 16. The lens driving device 1P is also provided with a cover member 91, which is different from the cover 42 in the other embodiments. The cover member 91 includes a circular center hole 92, and a cover glass 93 of a relatively small diameter fitted in the center hole 92. The cover member 91 having such a structure (with the cover glass 93 of a small diameter) is also applicable to other lens driving devices in the other embodiments described above. Also, the lens driving device 1P can use a drive magnet 81 that is magnetized with N and S poles in the direction of the optical axis 11 such as the one used in the lens driving device 1N, instead of the drive magnet 16.

If a portable device (e.g., a camera, portable telephone with camera, etc.) that is equipped with the lens driving device 1P becomes inoperative due to some electrical failures, the lens can still be moved to a retaining position by a certain force, such as a centrifugal force, a force of inertia or the like, which may be generated, for example, through holding and shaking the camera by hand. The lens can be retained at the retaining position by the magnetic attraction force between the drive magnet and the magnetic member 32 or 34. Such a manual operation to move the lens is also applicable to the other embodiments described above that use drive coils. In other words, the lens driving device 1P would not encounter a situation where coils are broken or the operation voltage level lowers, and the electrical control is lost. Instead, because the position of the lens 14 can be switched by a mechanical force, the worst situation where the lens driving device becomes inoperative due to the electrical failure can be avoided. In view of the operation by hand, the drive magnet may preferably be disposed on the side of the moving body 10. However, a drive coil may be disposed on the side of the moving body 10, instead.

The lens driving devices 1 and 1A through 1N are examples of preferred embodiments of the present invention, and a variety of modifications can be made without departing from the subject matter of the present invention. For example, without being limited to switching between an ordinary photographing and a macro photographing, the present invention is likewise applicable to any devices that need to change the position of a lens to two, three or more different locations. For example, the present invention is applicable to a collapsible lens barrel mechanism that may be mounted on a camera with a collapsible lens barrel, which is capable of storing the lens barrel inside a main body of the camera, when the camera is not in use. Also, the present invention is applicable to a focal distance switching mechanism of a camera that can switch its focal distance between a short focus position and a long focus position.

In the present embodiments, the lens 14 is formed from two lenses 14a and 14b. However, the lens 14 may be composed of a single lens or a combination of three or more lenses. Also, each of the lenses 14a and 14b is formed from an aspherical lens, but can be formed from a spherical glass lens or an aspherical glass lens.

Also, each of the examples shown above includes a single moving body 10 and a single fixed body 24. However, two, three or more sets of moving bodies 10 and fixed bodies 24 may be disposed one on top of the other or arranged successively in the direction of the optical axis 11. Also, a lens driving device may be provided with a single fixed body 24 and plural sets of moving bodies 10 and plural drive coils provided on the fixed body side.

Also, in each of the embodiments or in the description of the principle of manually operating the lens driving device, each of the lens driving devices 1 and 1A through 1N and the lens driving device 1P is described as an example of a mechanism that forms a part of a camera section of a portable telephone with camera. However, the lens driving devices and thin cameras in accordance with the present invention can be used for other portable equipment such as mobile computers and PDAs, or incorporated in other camera devices such as monitor cameras and medical cameras, and any electronic devices that may be used in automobiles, TVs and the like.

In one aspect of the present invention, a moving body is provided with a relatively simple structure in which it moves together with a lens in an optical axis direction. Accordingly, the present invention provides lens driving devices and portable equipment with camera, which have a relatively simple structure and are suitable for miniaturization. In another aspect of the present invention, in addition to the above, a supply of an electric power is not required to retain a lens at predetermined stop positions, and the lens can be retained at each of the stop positions by a magnetic attraction force working between a driving magnet and a magnetic member. As a result, the power consumption can be reduced, and therefore lens driving devices that are suitable for mounting on portable equipment and portable equipment with camera having such lens driving devices can be obtained.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A lens driving device comprising:
a moving body having a lens and a drive magnet that is moveable with the lens in an optical axis direction of the lens; and
a fixed body that moveably supports the moving body in the optical axis direction, the fixed body including a first drive coil and a second drive coil that are disposed apart from each other in the optical axis direction so as to have a gap between the first drive coil and the second drive coil and form magnetic circuits with the drive magnet, and
a first magnetic member and a second magnetic member that are disposed opposite the first drive coil and the second drive coil, respectively,
wherein the drive magnet is disposed in the gap between the first drive coil and the second drive coil, and the drive magnet is moved in the optical axis direction to a first specified position which is nearer to the first drive coil and the first magnetic member or to a second specified position which is nearer to the second drive coil and the second magnetic member; and
wherein the drive magnet is moved to the first specified position together with the moving body through energization of the first drive coil, and the moving body is retained at the first specified position by magnetic attraction working between the drive magnet and the first magnetic member after energization of the first drive coil is stopped.

2. A lens driving device according to claim 1, wherein the drive magnet is moved to the second specified position together with the moving body through energization of the second drive coil, and the moving body is retained at the second specified position by magnetic attraction working between the drive magnet and the second magnetic member after energization of the second drive coil is stopped.

3. A lens driving device according to claim 1, wherein the moving body is moved between the first drive coil and the second drive coil through energization of both of the first drive coil and the second drive coil.

4. A lens driving device according to claim 1, wherein the moving body includes a cylindrical lens barrel that retains the lens, and the drive magnet is affixed in one piece to an outer circumference of the lens barrel.

5. A portable equipment with a camera comprising:
a camera unit; and
a lens driving device mounted on the camera unit, wherein the lens driving device comprises a moving body having a lens and a drive magnet that is moveable with the lens in an optical axis direction of the lens, and
a fixed body that moveably supports the moving body in the optical axis direction, the fixed body including a first drive coil and a second drive coil that are disposed apart from each other in the optical axis direction so as to have a gap between the first drive coil and the second drive coil and form magnetic circuits with the drive magnet,
and a first magnetic member and a second magnetic member that are disposed opposite the first drive coil and the second drive coil, respectively,
wherein the drive magnet is disposed in the gap between the first drive coil and the second drive coil, and the drive magnet is moved in the optical axis direction to a first specified position which is nearer to the first drive coil and the first magnetic member or to a second specified position which is nearer to the second drive coil and the second magnetic member, and
wherein the drive magnet is moved to the first specified position together with the moving body through energization of the first drive coil, and the moving body is retained at the first specified position by magnetic attraction working between the drive magnet and the first magnetic member after energization of the first drive coil is stopped.

6. A portable equipment with camera according to claim 5, wherein the drive magnet is moved to the second specified position together with the moving body through energization of the second drive coil, and the moving body is retained at the second specified position by magnetic attraction working between the drive magnet and the second magnetic member after energization of the second drive coil is stopped.

7. A portable equipment with camera according to claim 5, wherein the moving body is moved between the first drive coil and the second drive coil through energization of both of the first drive coil and the second drive coil.

8. A portable equipment with camera according to claim 5, wherein the moving body includes a cylindrical lens barrel that retains the lens, and the drive magnet is affixed in one piece to an outer circumference of the lens barrel.

9. A portable equipment with a camera comprising:
a lens driving device defining an object lens side and an inner side opposite the object lens side,
the lens driving device comprising a moving body having a lens and a drive magnet that is moveable with the lens in an optical axis direction of the lens,
and a fixed body that moveably supports the moving body in the optical axis direction, the fixed body including a first drive coil and a second drive coil that are disposed apart from each other in the optical axis direction so as to have a gap between the first drive coil and the second drive coil and form magnetic circuits with the drive magnet,
and a first magnetic member and a second magnetic member that are disposed opposite the first drive coil and the second drive coil, respectively,
wherein the drive magnet is disposed in the gap between the first drive coil and the second drive coil, and the drive magnet is moved in the optical axis direction to a first specified position which is nearer to the first drive coil and the first magnetic member or to a second specified position which is nearer to the second drive coil and the second magnetic member, and
wherein the drive magnet is moved to the first specified position together with the moving body through energization of the first drive coil, and the moving body is retained at the first specified position by magnetic attraction working between the drive magnet and the first magnetic member after energization of the first drive coil is stopped;
a cover disposed on the object lens side of the lens driving device, and having an outer surface that is exposed, wherein the cover transmits light from outside and seals an interior of the lens driving device;
an image pickup element that is disposed on an opposite side of the covet in the optical axis direction with the lens of the lens driving device interposed in between; and
a circuit substrate that is connected to the image pickup element, wherein the circuit substrate is disposed in the rear of the lens driving device within a diameter of the lens driving device.

* * * * *